(12) United States Patent
Depp et al.

(10) Patent No.: US 6,561,822 B2
(45) Date of Patent: May 13, 2003

(54) ELECTRICAL JUNCTION BOX COVER ASSEMBLY

(75) Inventors: Charles Depp, Saline, MI (US); Bennie Malcom, Detroit, MI (US); Nancy Singh, Lake Orion, MI (US)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 10/059,539

(22) Filed: Jan. 30, 2002

(65) Prior Publication Data

US 2002/0102871 A1 Aug. 1, 2002

Related U.S. Application Data

(60) Provisional application No. 60/265,525, filed on Jan. 31, 2001.

(51) Int. Cl.[7] ................................................. H05K 1/00
(52) U.S. Cl. ..................................... 439/76.2; 439/521
(58) Field of Search ............................. 439/76.2, 949, 439/521, 135; 174/65 R; 248/68.1

(56) References Cited

U.S. PATENT DOCUMENTS

| | | | | |
|---|---|---|---|---|
| 4,195,194 A | * | 3/1980 | Kuster et al. .................. 174/59 |
| 5,000,218 A | * | 3/1991 | Hayasaki et al. ........... 137/377 |
| 5,497,036 A | * | 3/1996 | Zemlicka ..................... 307/9.1 |
| 5,882,213 A | * | 3/1999 | Witck et al. ................ 439/76.2 |
| 5,947,426 A | * | 9/1999 | Kraus ......................... 248/74.2 |
| 6,069,315 A | * | 5/2000 | Tang ............................ 174/50 |
| 6,070,836 A | * | 6/2000 | Battie et al. .................. 24/68.1 |
| 6,126,458 A | * | 10/2000 | Gregory, II et al. ........ 439/76.2 |
| 6,461,171 B2 | * | 10/2002 | Kanaoka et al. ........... 439/76.2 |
| 6,462,270 B1 | * | 10/2002 | Depp et al. .................... 174/50 |

FOREIGN PATENT DOCUMENTS

JP        10-257649        9/1998

* cited by examiner

Primary Examiner—P. Austin Bradley
Assistant Examiner—Ross Gushi
(74) Attorney, Agent, or Firm—Bliss McGlynn, P.C.

(57) ABSTRACT

An electrical junction box cover assembly for a motor vehicle includes a mounting cover and a junction box at least partially disposed in the mounting cover. The electrical junction box cover assembly also includes a connector connected to the junction box and having at least one wire extending therefrom out of the mounting cover. The electrical junction box cover assembly includes a top cover connected to the mounting cover with the at least one wire extending therebetween. The electrical junction box cover assembly further includes at least one clip extending from either one of the mounting cover and the junction box past an outer surface of the mounting cover to retain the at least one wire in a predetermined position relative thereto.

20 Claims, 6 Drawing Sheets

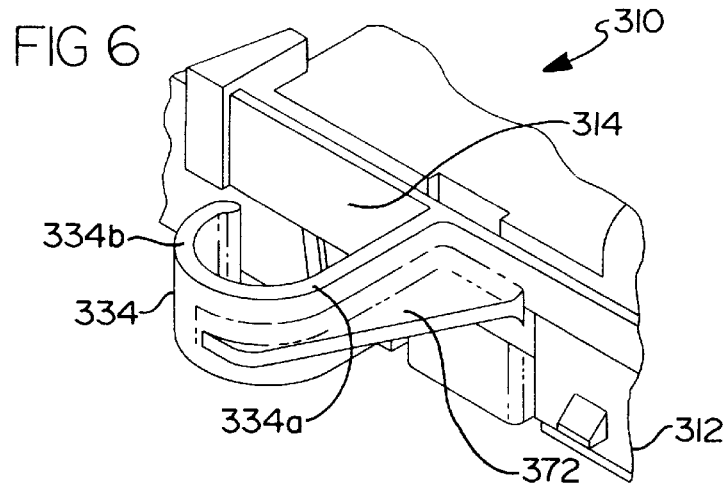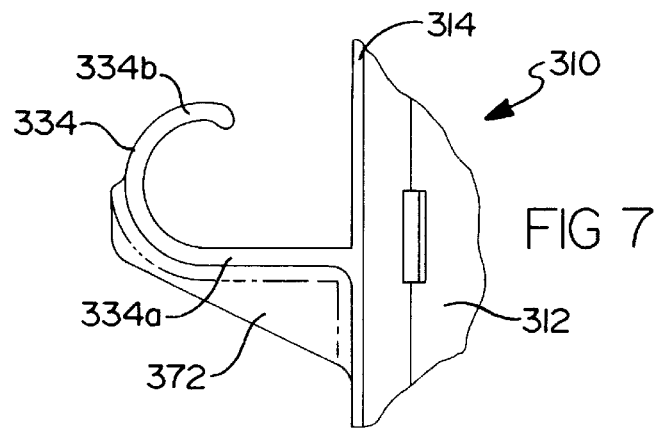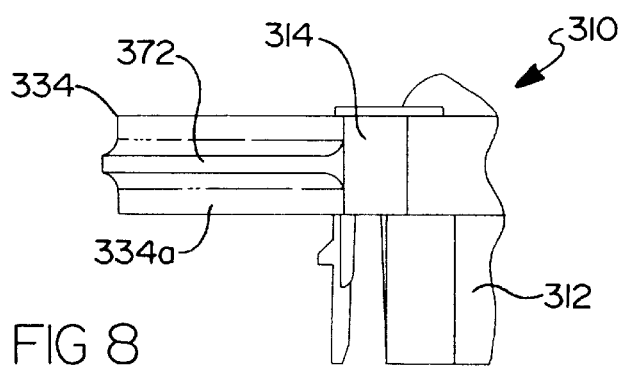

ELECTRICAL JUNCTION BOX COVER ASSEMBLY

CROSS-REFERENCE TO RELATED APPLICATION(S)

The present invention claims the priority date of copending U.S. Provisional Patent Application Serial No. 60/265,525, filed Jan. 31, 2001.

BACKGROUND OF THE INVENTION

1. Field of the Invention

The present invention relates generally to electrical junction boxes and, more particularly, to an electrical junction box cover assembly for a motor vehicle.

2. Description of the Related Art

Electrical junction boxes and connectors have been provided to connect and retain wires together on a motor vehicle. These electrical junction boxes typically have electrical connectors connected thereto with wires extending from the electrical connectors.

One disadvantage of these electrical junction boxes and connectors is that, if the junction box is placed in a mounting cover, the wires may interfere with a top cover and the top cover may not properly latch to the mounting cover during assembly. Another disadvantage is that the wires may extend from between the mounting cover and top cover at any location. Yet another disadvantage is that the wires may extend away from the mounting cover and are free to move, which is undesired.

It is known to provide a wire retention mechanism to retain wires. An example of such a wire retention mechanism is disclosed in Japanese Patent Application No. 10-257,679, published Sep. 25, 1998. In this patent application, the wire retention mechanism includes two arms forming a generally rectangular configuration to retain a wire therebetween. However, only one wire is retained and a large amount of force is needed to dispose the wire between the arms to retain the wire, which is undesired. Further, the wire retention mechanism is not provided adjacent a wire housing exit. Thus, there is a need in the art to provide an electrical junction box cover assembly for a motor vehicle, which in a simple manner allows retention of the wires and eliminates movement of the wires and interference during assembly.

SUMMARY OF THE INVENTION

It is, therefore, one object of the present invention to provide an electrical junction box cover assembly for a motor vehicle.

To achieve the foregoing objects, the present invention is an electrical junction box cover assembly for a motor vehicle including a mounting cover, a junction box at least partially disposed in the mounting cover, and a connector connected to the junction box and having at least one wire extending therefrom out of the mounting cover. The electrical junction box cover assembly also includes a top cover connected to the mounting cover with the at least one wire extending therebetween. The electrical junction box cover assembly includes at least one clip extending from either one of the mounting cover and junction box past an outer surface of the mounting cover to retain the at least one wire in a predetermined position relative thereto.

One feature of the present invention is that an electrical junction box cover assembly is provided for a motor vehicle to retain wires extending therefrom. Another feature of the present invention is that the electrical junction box cover assembly has at least one clip to retain one or more wires in a predetermined position. Yet another feature of the present invention is that the electrical junction box cover assembly has at least one clip molded to either the mounting cover or junction box to retain wires of a wire harness to aid in assembly at an assembly plant. A further feature of the present invention is that the electrical junction box cover assembly has a reinforcing support molded to the clip to support the clip to retain at least one wire.

Other objects, features, and advantages of the present invention will be readily appreciated, as the same becomes better understood, after reading the subsequent description taken in conjunction with the accompanying drawings.

BRIEF DESCRIPTION OF THE DRAWINGS

FIG. 6 is a perspective view of still another embodiment, according to the present invention, of the electrical junction box cover assembly of FIG. 1.

FIG. 7 is a plan view of the electrical junction box cover assembly of FIG. 6.

FIG. 8 is an elevational view of the electrical junction box cover assembly of FIG. 6.

DESCRIPTION OF THE PREFERRED EMBODIMENT(S)

Figure 1:
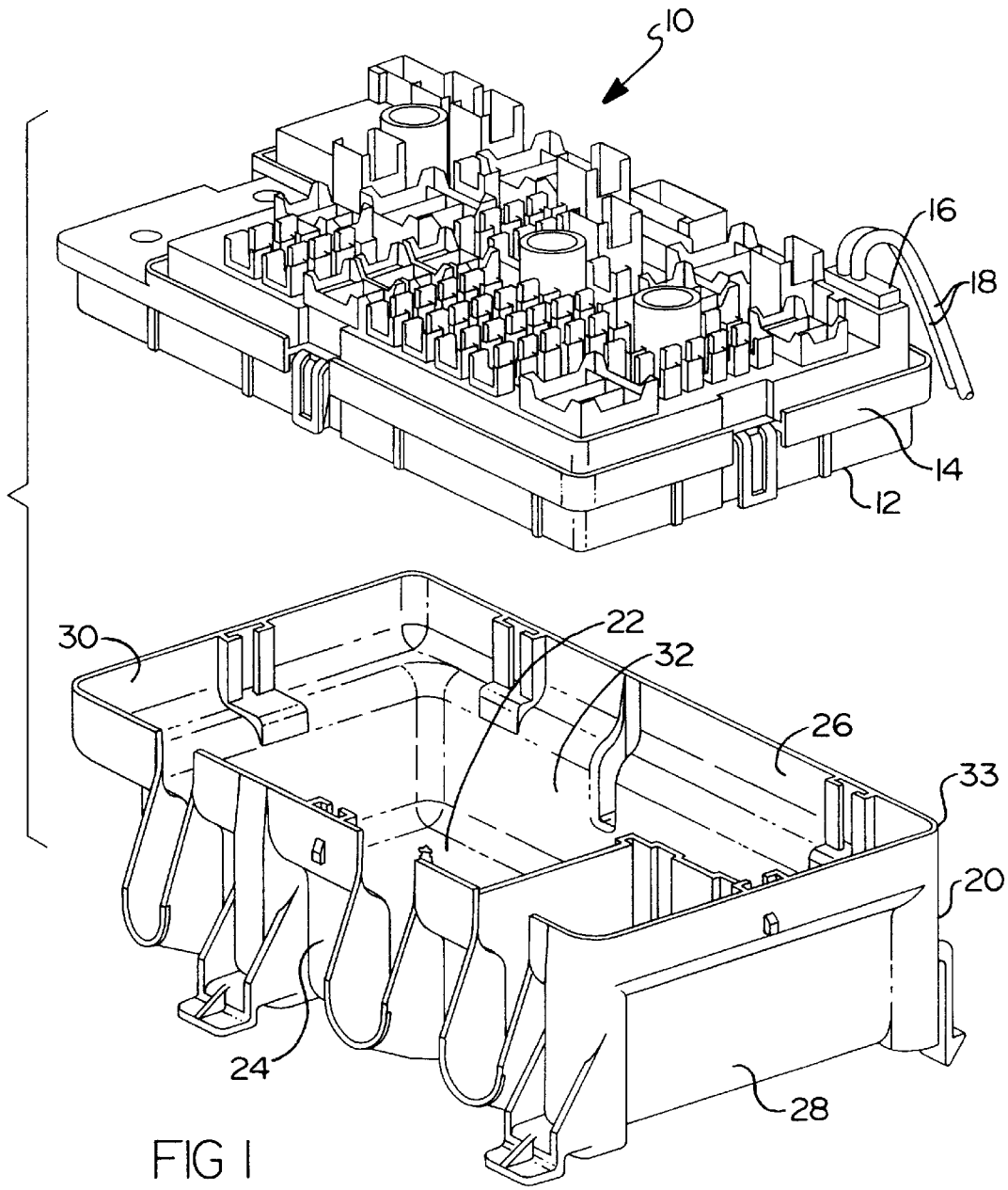
FIG. 1 is an exploded perspective view of an electrical junction box cover assembly, according to the present invention, illustrating a top cover removed.
Figure 2:
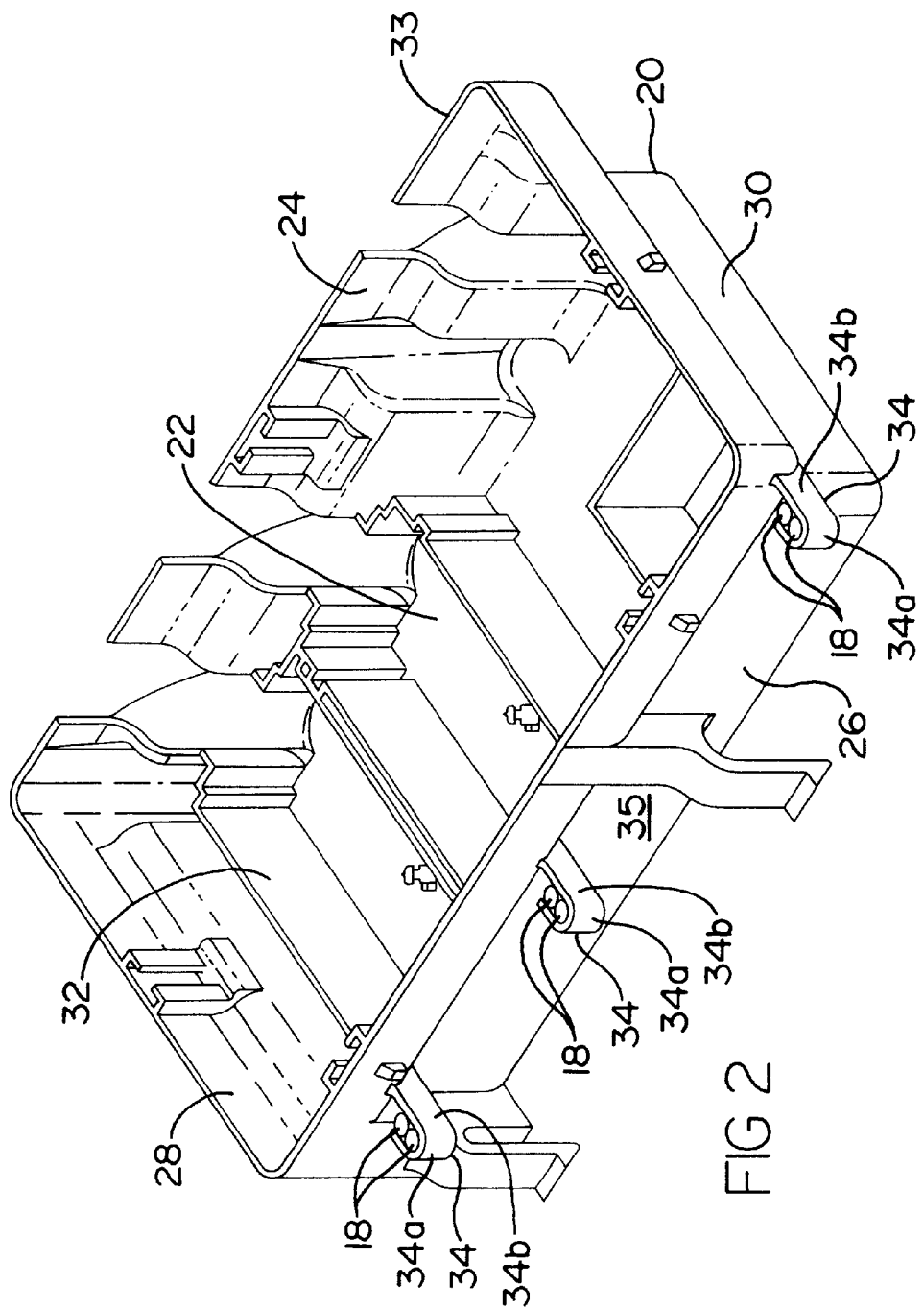
FIG. 2 is a perspective view of a mounting cover, according to the present invention, of the electrical junction box cover assembly of FIG. 1.

Referring to FIGS. 1 and 2, an electrical junction box cover assembly 10, according to the present invention, is shown for a motor vehicle (not shown). The electrical junction box cover assembly 10 includes a junction box 12 having a generally "T" shaped flange 14 for a function to be described. The junction box 12 is generally rectangular in shape. The electrical junction box cover assembly 10 includes at least one electrical connector 16 connected thereto. The electrical connector 16 has at least one, preferably a plurality of electrical wires 18 extending therefrom. The electrical wires 18 are a predetermined gauge of wire such as ten (10) gauge. The junction box 12 is preferably a one-piece molded plastic member. It should be appreciated that the junction box 12, electrical connector 16, and electrical wires 18 are conventional and known in the art.

Referring to FIGS. 1 and 2, the electrical junction box cover assembly 10 includes a mounting cover 20 for receiving the junction box 12. The mounting cover 20 is generally rectangular in shape. The mounting cover 20 has a bottom wall 22 and opposed side walls 24 and 26 and end walls 28 and 30 extending upwardly from the bottom wall 22 and connected together to form a cavity 32. The cavity 32 receives a portion of the junction box 12 and a lower part of the flange 14 is disposed over an edge 33 of the mounting cover 20. The mounting cover 20 also includes at least one, preferably a plurality of clips 34 extending outwardly beyond an outer surface 35 of one of the side walls 24 and 26 and/or end walls 28 and 30, preferably from the side wall 26. In a preferred embodiment, the clips 34 are generally "J" shaped and spaced along the side wall 26 to retain the wires 18 in a predetermined position relative to the mounting cover 20. Each of the clips 34 has a straight portion 34a extending generally perpendicular to the sidewall 26 and an arcuate portion 34b at a free end of the straight portion 34a. The clips 34 are molded to the mounting cover 20 to retain at least one, preferably a plurality of the electrical wires 18 to aid in assembly. The mounting cover 20 and clips 34 are molded as one-piece from a plastic material and are integral and unitary.

Figure 3:
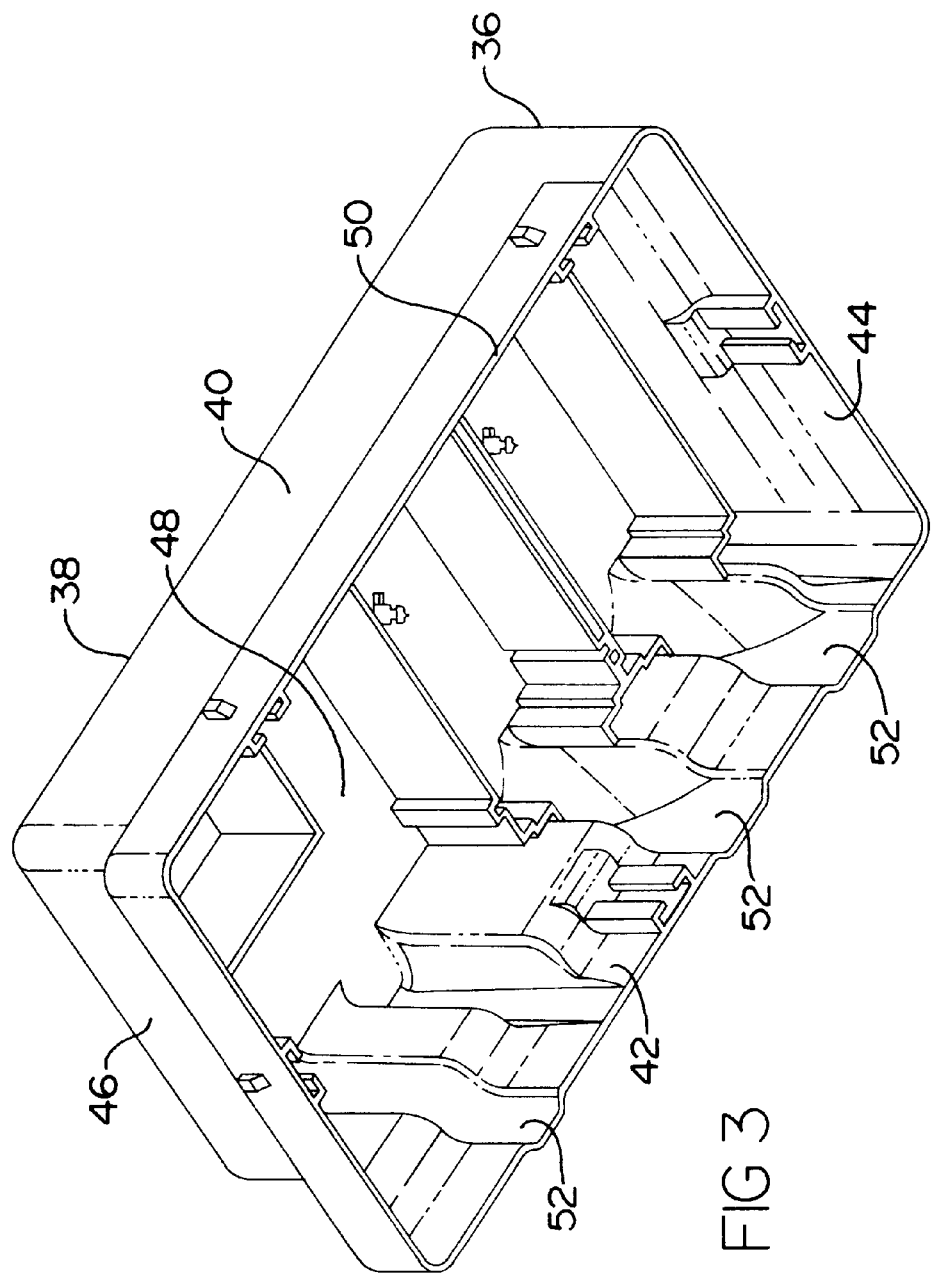
FIG. 3 is a perspective view of a top cover of the electrical junction box cover assembly of FIG. 1.

Referring to FIG. 3, the electrical junction box cover assembly 10 further includes a top cover 36 for covering the junction box 12 and being removably attached to the mounting cover 20. The top cover 36 is generally rectangular in shape. The top cover 36 has a top wall 38 and opposed side walls 40 and 42 and end walls 44 and 46 extending downwardly from the top wall 38 and connected together to form a cavity 48. The cavity 48 receives a portion of the junction box 12 and an upper part of the flange 14 is disposed over an edge 50 of the top cover 36. The side wall 42 has at least one, preferably a plurality of recess portions 52 to allow the electrical wires 18 to extend from the junction box 12 and between the mounting cover 20 and top cover 36 to be external or outside of the mounting cover 20 for subsequent connection.

In assembly of the electrical junction box cover assembly 10, the electrical connector 16 is connected to the junction box 12. The junction box 12 is at least partially disposed in the cavity 30 of the mounting cover 20 with the flange 14 disposed over the edge 33 thereof. In operation, an operator disposes the wires 18 from one of the electrical connectors 16 adjacent the straight portion 34a of one of the clips 34 and pulls the wires 18 forward to dispose the wires 18 in the arcuate portion 34b of the "J" shape of the clip 34. The top cover 36 is disposed over the junction box 12 and the flange 14 is disposed over the edge 50 thereof. It should be appreciated that the arcuate portion 34b is flexible to allow deflection to retain the wires 18 in a predetermined position to the mounting cover 20. It should also be appreciated that the top cover 36 is removably connected by suitable means such as a latch (not shown) to the mounting cover 20. It should also be appreciated that the top cover 36 may be connected to the mounting cover 20 before the wires 18 are disposed in the clips 34.

Figure 4:
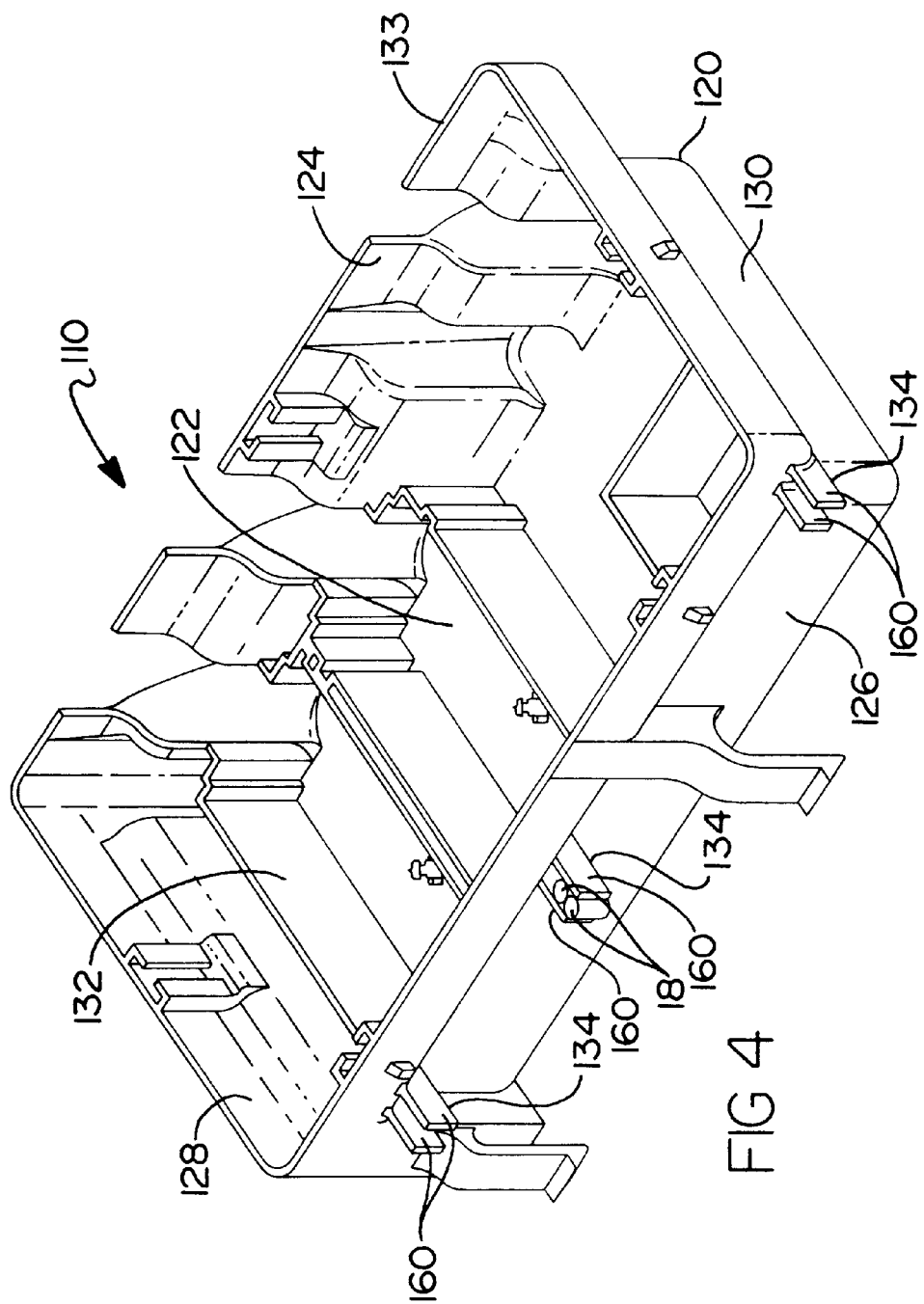
FIG. 4 is a perspective view of another embodiment, according to the present invention, of the electrical junction box cover assembly of FIG. 1.

Referring to FIG. 4, another embodiment, according to the present invention, of the electrical junction box cover assembly 10 is shown. Like parts of the electrical junction box cover assembly 10 have like reference numerals increased by one hundred (100). In this embodiment, the electrical junction box cover assembly 110 includes a mounting cover 120 having at least one, preferably a plurality of clips 134 extending outwardly from one of the side walls 124 and 126 and/or end walls 128 and 130, preferably from the side wall 126. In a preferred embodiment, each of the clips 134 have a pair of fingers 160 spaced laterally and are flexible to allow deflection to retain the wires 18 in a predetermined position to the mounting cover 120. The clips 134 are molded to the mounting cover 120 to retain at least one, preferably a plurality of the electrical wires 18 to aid in assembly. The mounting cover 120 and clips 134 are molded as one-piece from a plastic material and are integral and unitary. In operation, an operator pushes the wires 18 into the space between the fingers 160 which are deflected laterally until the wires 18 are disposed therein and are retained in the space when the fingers 160 return to their original position.

Figure 5:
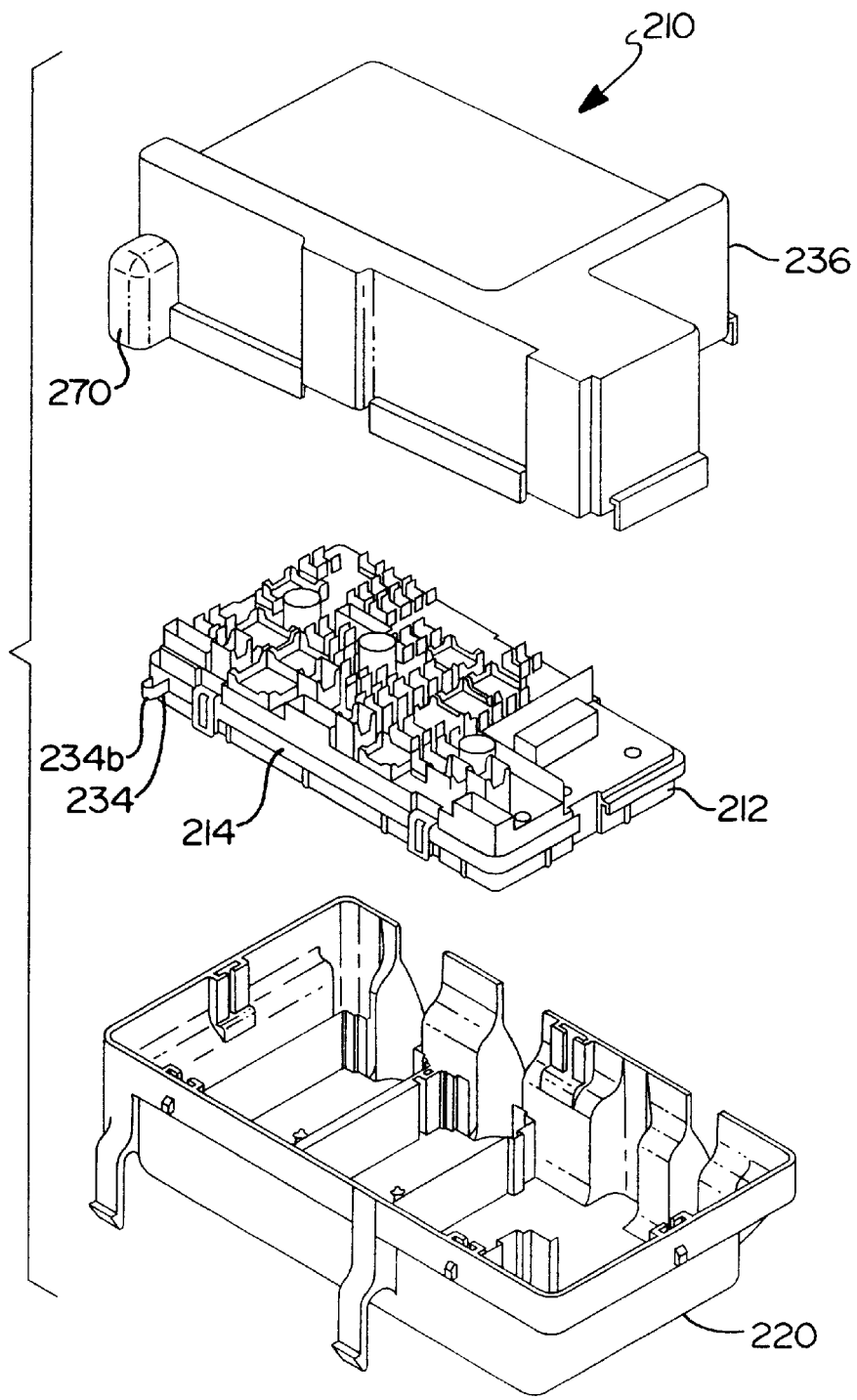
FIG. 5 is an exploded perspective view of yet another embodiment, according to the present invention, of the electrical junction box cover assembly of FIG. 1.

Referring to FIG. 5, yet another embodiment, according to the present invention, of the electrical junction box cover assembly 10 is shown. Like parts of the electrical junction box cover assembly 10 have like reference numerals increased by two hundred (200). In this embodiment, the electrical junction box cover assembly 210 includes a junction box 212 having at least one, preferably a plurality of clips 234 extending outwardly from one side of the flange 214. In this embodiment, the top cover 236 may have a recessed portion 270 disposed adjacent the clips 234 and extending outwardly to enclose the clips 234 to form a more effective seal between the mounting cover 220 and the top cover 236. In operation, an operator pushes the wires 18 into the space of the arcuate portion 234b which is deflected laterally until the wires 18 are disposed therein and the wires 18 are retained in the space when the arcuate portion 234b returns to its original position.

Referring to FIGS. 6 through 8, still another embodiment, according to the present invention, of the electrical junction box cover assembly 10 is shown. Like parts of the electrical junction box cover assembly 10 have like reference numerals increased by three hundred (300). In this embodiment, the electrical junction box cover assembly 310 includes a junction box 312 having at least one, preferably a plurality of clips 334 extending outwardly from one side of the flange 314. The electrical junction box cover assembly 310 includes a reinforcing support 372 extending between the straight portion 334b of the clip 334 and the flange 314. The reinforcing support 372 is generally triangular in shape. The reinforcing support 372 is molded to the clip 334 and flange 314 to support the clip 334 and resist deflection of the clip 334 toward the junction box 312 during assembly. The reinforcing support 372 and clips 334 are molded as one-piece from a plastic material and are integral and unitary. It should be appreciated that that the reinforcing support 372 may extend to the arcuate portion 334b of the clip 334. It should also be appreciated that the operation of the clips 334 is similar to the clip 34, 134.

The present invention has been described in an illustrative manner. It is to be understood that the terminology, which has been used, is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. An electrical junction box cover assembly for a motor vehicle comprising:
   a mounting cover;
   a junction box at least partially disposed in said mounting cover;
   a connector connected to said junction box and having at least one wire extending therefrom out of said mounting cover;
   a top cover connected to said mounting cover with the at least one wire extending therebetween; and
   at least one clip extending from either one of said mounting cover and said junction box past an outer surface of said mounting cover to retain said at least one wire in a predetermined position relative thereto.

2. An electrical junction box cover assembly as set forth in claim 1 wherein said at least one clip has a general J shape.

3. An electrical junction box cover assembly as set forth in claim 1 wherein said at least one clip has a pair of fingers spaced laterally and extending generally perpendicular from said one of said mounting cover and said junction box.

4. An electrical junction box cover assembly as set forth in claim 1 wherein said at least one clip is molded to said one of said mounting cover and said junction box.

5. An electrical junction box cover assembly as set forth in claim 1 wherein said at least one clip is made of a plastic material.

6. An electrical junction box cover assembly as set forth in claim 1 wherein said at least one clip and said one of said mounting cover and said junction box are integral, unitary, and one-piece.

7. An electrical junction box cover assembly as set forth in claim 1 including a reinforcing support extending between said at least one clip and said one of said mounting cover and said junction box.

8. An electrical junction box cover assembly as set forth in claim 7 wherein said reinforcing support is generally triangular in shape.

9. An electrical junction box cover assembly as set forth in claim 7 wherein said reinforcing support is molded to said at least one clip and said one of said mounting cover and said junction box.

10. An electrical junction box cover assembly as set forth in claim 1 wherein said at least one clip has a straight portion extending generally perpendicular to said one of said mounting cover and said junction box.

11. An electrical junction box cover assembly as set forth in claim 10 wherein said at least one clip has an arcuate portion extending from said straight portion and toward said one of said mounting cover and said junction box.

12. An electrical junction box cover assembly for a motor vehicle comprising:

a mounting cover;

a junction box at least partially disposed in said mounting cover;

a connector connected to said junction box and having at least one wire extending therefrom out of said mounting cover;

a top cover connected to said mounting cover with the at least one wire extending therebetween; and at least one J shaped clip extending from either one of said mounting cover and said junction box past an outer surface of said mounting cover to retain said at least one wire in a predetermined position relative thereto.

13. An electrical junction box cover assembly as set forth in claim 12 wherein said at least one clip is molded to said one of said mounting cover and said junction box.

14. An electrical junction box cover assembly as set forth in claim 12 wherein said at least one clip is made of a plastic material.

15. An electrical junction box cover assembly as set forth in claim 12 wherein said at least one clip and said one of said mounting cover and said junction box are integral, unitary, and one-piece.

16. An electrical junction box cover assembly as set forth in claim 12 including a reinforcing support extending between said at least one clip and said one of said mounting cover and said junction box.

17. An electrical junction box cover assembly as set forth in claim 16 wherein said reinforcing support is generally triangular in shape.

18. An electrical junction box cover assembly as set forth in claim 16 wherein said reinforcing support is molded to said at least one clip and said one of said mounting cover and said junction box.

19. An electrical junction box cover assembly as set forth in claim 12 wherein said at least one clip has a straight portion extending generally perpendicular to said one of said mounting cover and said junction box.

20. An electrical junction box cover assembly as set forth in claim 19 wherein said at least one clip has an arcuate portion extending from said straight portion and toward said one of said mounting cover and said junction box.

* * * * *